United States Patent [19]

Parker

[11] Patent Number: 4,642,488
[45] Date of Patent: Feb. 10, 1987

[54] CMOS INPUT BUFFER ACCEPTING TTL LEVEL INPUTS

[75] Inventor: Lanny L. Parker, Mesa, Ariz.

[73] Assignee: Codex Corporation, Mansfield, Mass.

[21] Appl. No.: 772,223

[22] Filed: Sep. 3, 1985

[51] Int. Cl.[4] .......................................... H03K 19/094
[52] U.S. Cl. .................................... 307/475; 307/451; 307/360; 307/297
[58] Field of Search ................ 307/443, 448, 450–451, 307/475, 360, 361, 579, 585, 264, 297

[56] References Cited

U.S. PATENT DOCUMENTS

| | | | |
|---|---|---|---|
| 4,242,604 | 12/1980 | Smith | 307/443 |
| 4,471,242 | 9/1984 | Noufer et al. | 307/451 X |
| 4,472,647 | 9/1984 | Allgood et al. | 307/360 X |
| 4,477,737 | 10/1984 | Ulmer et al. | 307/297 |
| 4,482,824 | 11/1984 | Tzeng | 307/297 X |
| 4,501,978 | 2/1985 | Gentile et al. | 307/443 X |
| 4,521,696 | 4/1985 | Raghunathan | 307/360 X |
| 4,555,642 | 11/1985 | Morales | 307/475 |
| 4,585,955 | 4/1986 | Uchida | 307/443 X |

FOREIGN PATENT DOCUMENTS

0100541 6/1983 Japan ................................ 307/475

*Primary Examiner*—Stanley D. Miller
*Assistant Examiner*—D. R. Hudspeth
*Attorney, Agent, or Firm*—Walter W. Nielsen

[57] ABSTRACT

A Complementary Metal Oxide Semiconductor (CMOS) input buffer circuit is provided which accepts Transistor-Transistor Lock (TTL) input signal levels without generating any significant DC current path. A reference voltage circuit (1, FIG. 1) provides first and second reference voltages ($V_A$ and $V_B$, FIG. 1) which are coupled to first and second stages, respectively, of the input buffer circuit (3, FIG. 1), and which are of predetermined magnitudes and scaled relative to each other to permit the P-channel devices of the input buffer circuit to turn off completely when the input to the circuit is "high", while allowing a successively higher output at each successive stage of the input buffer circuit. The reference circuit 1 is compensated for power supply and process window variations.

13 Claims, 4 Drawing Figures

CMOS INPUT BUFFER ACCEPTING TTL LEVEL INPUTS

TECHNICAL FIELD

This invention relates generally to an electric circuit, and, in particular, to a Complementary Metal Oxide Semiconductor (CMOS) input buffer circuit which accepts Transistor-Transistor Logic (TTL) input signal levels without generating any significant DC current path.

BACKGROUND OF THE INVENTION

In the area of electronic components, it is highly desirable to provide integrated circuits which consume a minimum of electric power and which function at high speeds. CMOS integrated circuits in general meet these requirements.

It is more specifically desired to provide a CMOS circuit, which can be implemented, for example, as part of a monolithic integrated circuit, having CMOS input buffers whose performance is significantly improved in several ways. First, it is desired that a CMOS input buffer circuit be capable of accepting TTL level signal inputs and translating them into CMOS level signal outputs. Secondly, this must be done without consuming undue electric power. Thirdly, it is desired to provide such CMOS input buffer circuits with performance that is relatively immune to variations in manufacturing process parameters and to power supply changes. Fourthly, it is desired to provide a CMOS input buffer circuit which operates at a relatively higher speed than known CMOS input buffer circuits.

Figure 2:
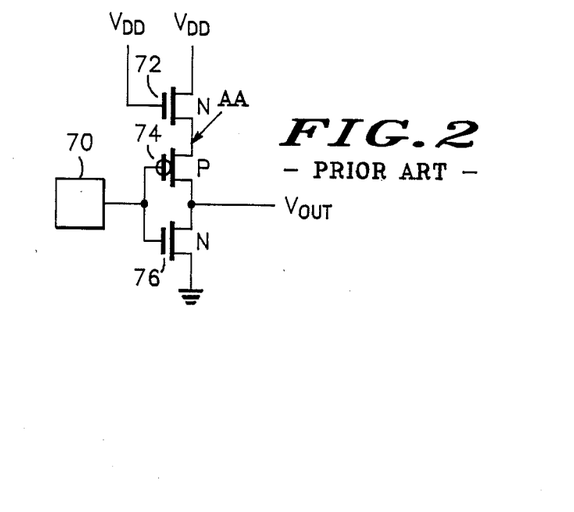
FIG. 2 illustrates a circuit diagram of a prior art CMOS input buffer.

A known CMOS inverting input buffer circuit is shown in FIG. 2, comprising input pad 70, a pair of N-channel devices 72 and 76, and a P-channel device 74. The prior art input buffer circuit is capable of translating a TTL-level input (ranging from a "low" input of 0.8 volts to a "high" input of 2.0 volts) into CMOS-level outputs, but it has a relatively high current consumption.

In the prior art circuit shown in FIG. 2, the function of N-channel device 72 is to drop the supply voltage $V_{DD}$ by one N-channel threshold, so that the gate-to-source potential drop across P-channel device 74 is minimized in order to minimize the current flowing through device 74 when the input level on pad 70 is "high". The supply voltage $V_{DD}$ is typically 5.0 volts ±0.25 volts.

P-channel device 74 and N-channel device 76 are ratioed (i.e., device 76 is given a higher current channel W/L ratio) to try to reduce the power consumption at the higher levels of the supply voltage $V_{DD}$, and to allow device 76 to sink the current flowing through devices 72 and 74 when the input is "high".

A disadvantage of the known CMOS input buffer circuit is that it is always drawing current when the input has a "high" level on input pad 70, so that its level of DC power consumption, while relatively low for many applications, is too high for other applications where power must be strictly conserved. For example, where it is used to implement a relatively large number of tri-stated input/output buffers, the power consumption is quite large.

BRIEF SUMMARY OF INVENTION

Accordingly, it is an object of the present invention to provide an improved CMOS integrated circuit input buffer.

It is also an object of the present invention to provide an improved CMOS integrated circuit input buffer which is capable of accepting TTL level signal inputs.

It is a further object of the present invention to provide an improved CMOS integrated circuit input buffer which is relatively immune to variations in manufacturing process parameters.

It is another object of the present invention to provide an improved CMOS integrated circuit input buffer which is relatively immune to power supply fluctuations.

It is yet another object of the present invention to provide an improved CMOS integrated circuit input buffer which has a speed-power product better than known CMOS input buffers.

These and other objects are achieved in accordance with a preferred embodiment of the invention by providing an input buffer circuit for translating transistor-transistor logic (TTL) level input signals into complementary metal oxide semiconductor (CMOS) level output signals, the circuit comprising an input terminal for accepting the TTL level input signals; an output terminal for outputting the CMOS level output signals; first and second supply voltages; a reference circuit coupled to the first and second supply voltages for providing first and second reference voltages; first and second CMOS inverter stages, the first CMOS inverter stage being coupled to the input terminal and generating high and low level output signals, the second CMOS inverter stage being responsive to the output signals of the first CMOS inverter stage and generating high and low level output signals to the output terminal; means for coupling the first reference voltage to the first CMOS inverter stage, the magnitude of the first reference voltage being of a predetermined value relative to one of the TTL level input signals, such that when the one TTL level input signal is applied at the input terminal the first CMOS inverter stage generates the low level output signal without providing a DC path; and means for coupling the second reference voltage to the second CMOS inverter stage, the magnitude of the second reference voltage being of a predetermined value relative to the first CMOS inverter stage high level output signal, such that when the first CMOS inverter stage high level output signal is applied to the second CMOS inverter stage the second CMOS inverter stage generates the low level output signal at the output terminal without providing a DC path.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE INVENTION

Figure 1:
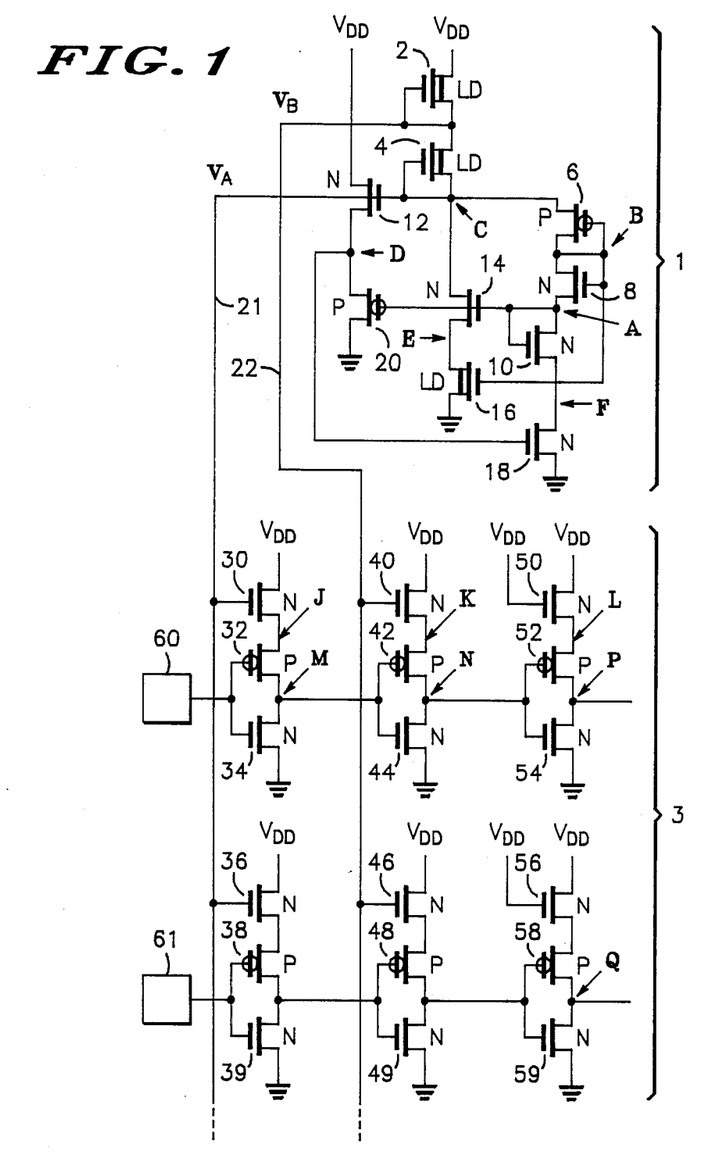
FIG. 1 shows a circuit diagram illustrating a preferred embodiment of the CMOS input buffer incorporating the present invention.

Referring now to FIG. 1, a circuit diagram of the CMOS input buffer of the present invention is shown. The upper portion, indicated generally by reference numeral 1, serves as a voltage reference providing reference voltages $V_A$ and $V_B$. When a 5.0 volt CMOS process is used to fabricate the circuit, supply voltage $V_{DD}$ is typically 5.0 volts ±0.25 volts, reference voltage $V_B$ is typically 4.6 volts, and reference voltage $V_A$ is typically about 0.6 volts less than $V_B$, or about 4.0 volts.

The lower portion 3 refers generally to the input buffer portion of the circuit. Reference voltage $V_A$, generated in upper portion 1, drives pull-up devices 30 and 36 of the input buffers associated with input pads 60 and 61, respectively. Correspondingly, reference voltage $V_B$ drives pull-up devices 40 and 46 of the input buffers.

Upper portion 1 comprises lightly-depleted field effect N-channel devices 2, 4, and 16. It also includes enhancement type field effect N-channel devices 8, 10, 12, 14, and 18. In addition it includes enhancement type field effect P-channel devices 6 and 20.

Lower portion 2 comprises enhancement type N-channel devices 30, 34, 36, 39, 40, 44, 46, 49, 50, 54, 56, and 59. It also includes enhancement type P-channel devices 32, 38, 42, 48, 52, and 58.

Regarding the reference voltage portion 1 of the circuit, N-channel device 2 has its drain coupled to $V_{DD}$ and its gate and source coupled to the drain of device 4. N-channel device 4 has its gate and source coupled to node C. P-channel device 6 has its source coupled to node C and its drain and gate coupled to node B. N-channel device 8 has its drain and gate coupled to node B and its source coupled to node A. N-channel device 10 has its drain and gate coupled to node A and its source coupled to node F.

Device 12 has its drain coupled to $V_{DD}$, its gate coupled to node C, and its source coupled to node D. Device 14 has its drain coupled to node C, its gate coupled to node A, and its source coupled to node E. Device 16 has its drain coupled to node E, its gate to node B, and its source to ground. Device 18 has its drain coupled to node F, its gate coupled to node D, and its source to ground. Device 20 has its source coupled to node D, its gate coupled to that of device 14, and its drain coupled to ground.

Reference voltage $V_A$ is output at the gate of device 12, while reference voltage $V_B$ is output at the gate/source connection of device 2.

Regarding the input buffer portion of the circuit, devices 30, 40, and 50 have their drains coupled to $V_{DD}$. Device 50 also has its gate coupled to $V_{DD}$. Devices 30, 40, and 50 have their sources coupled to the sources of devices 32, 42, and 52, respectively.

Device 30 has its gate coupled to reference voltage $V_A$. Device 40 has its gate coupled to reference voltage $V_B$.

Device 32 has its gate coupled to an input terminal in the form of input pad 60 and to the gate of device 34. Device 32 has its drain coupled to the gates of devices 42 and 44 and to the drain of device 34. Device 34 has its source coupled to ground.

Device 42 has its drain coupled to the gates of devices 52 and 54 and to the drain of device 44. Devices 44 and 54 have their sources coupled to ground. Devices 52 and 54 have their drains coupled together and to an output terminal in the form of node P.

Devices 36, 46, and 56 have their drains coupled to $V_{DD}$. Device 56 also has its gate coupled to $V_{DD}$. Devices 36, 46, and 56 have their sources coupled to the sources of devices 38, 48, and 58, respectively.

Device 36 has its gate coupled to $V_A$. Device 46 has its gate coupled to $V_B$.

Device 38 has its gate coupled to input pad 61 and to the gate of device 39. Device 38 has its drain coupled to the gates of devices 48 and 49 and to the drain of device 39. Device 39 has its source coupled to ground.

Device 48 has its drain coupled to the gates of devices 58 and 59 and to the drain of device 49. Devices 49 and 59 have their sources coupled to ground. Device 58 has its drain coupled to the drain of device 59 and to an output terminal in the form of node Q.

OPERATION OF PREFERRED EMBODIMENT

With reference now specifically to the reference voltage generating portion 1 of the CMOS input buffer of the preferred embodiment of the invention, it is desired to provide a voltage at node C which is relatively constant with respect to variations in the power supply $V_{DD}$ (e.g. $V_{DD}$ can be considered to range from 4.5 volts to 5.5 volts), and which is also relatively constant regarding variations in the CMOS manufacturing process parameters.

As stated above, a primary objective of the CMOS input buffer circuit of the present invention is to provide an input buffer which accepts TTL input levels and generates CMOS output levels while minimizing any DC current path. It will be understood that a DC current path will exist however during the switching transient, as the inputs to the buffers change state.

"Normal" TTL input levels at the input pads 60, 61 for the device illustrated in FIG. 1 are 0.8 volts for a "low" input and 2.0 volts for a "high" input. It is desired to provide CMOS output levels of 0.0 volts "low" and 4.0 volts "high", assuming a CMOS process is used which provides a 1.0 volt threshold, including "body effect".

With respect to the operation of the circuit shown in FIG. 1, let us first analyze the operation of the first CMOS inverting input buffer stage comprising input pad 60 and devices 30, 32, and 34. If we assume for the moment that device 30 and reference voltage $V_B$ were omitted and that the potential at node J were $V_{DD}$ or 5.0 volts, the "high" input of 2.0 volts on input pad 60 would be insufficient to turn off P-channel device 32. Normally, for a P-channel device such as P-channel device 32 to turn off, the voltage at its gate should be within approximately 0.8 volts of its source voltage (i.e. the voltage at node J). It should be noted, however, that due to "body effect", occurring when the source of a device is not at ground, the effective threshold may be several tenths of a volt higher than the nominal 0.8 threshold voltage. It will be assumed, for the present discussion, that the effective threshold, regarding those N-channel and P-channel devices whose sources are not at ground, is approximately 1.0 volts.

Thus provision must be made within the circuit to provide a voltage at node J which is approximately 1.0 volt above the "high" input voltage of 2.0 volts. To provide the required 3.0 volts at node J, a reference voltage $V_A$ of approximately 4.0 volts is applied to the gate of N-channel device 30. After a gate-to-source threshold drop of approximately 1.0 volt across N-channel device 30, the voltage at node J is approximately 3.0 volts. This is sufficiently low, then, to permit P-channel device 32 to turn off when the input on pad 60 goes "high". The output of the inverting input buffer, represented by node M, is approximately 3.0 volts in the "high" state and 0.0 volts in the "low" state.

The 3.0 volt "high" output of the first inverter comprising devices 30, 32, and 34 is insufficient for a CMOS "high" level. Thus a second inverter comprising devices 40, 42, and 44 is coupled to the output of the first inverter, and a third inverter comprising devices 50, 52, and 54 is coupled to the output of the second inverter.

Regarding the second inverter comprising devices 40, 42, and 44, a "high" input value of 3.0 volts applied to the gate of P-channel device 42 means that the potential at node K must be approximately 4.0 volts or less for device 42 to shut off completely for a "high" input value. For node K to be 4.0 volts, reference potential $V_B$ should be no higher than approximately 5.0 volts. In actuality, devices 2 and 4 are ratioed so that $V_B$ is approximately 0.6 volts higher than $V_A$ or about 4.6 volts.

With $V_B$ at approximately 4.6 volts, node K is then approximately 3.6 volts, and the output of the second inverter, represented by node N, is approximately 3.6 volts in the "high" state and 0.0 volts in the "low" state.

Analyzing now the third inverter comprising devices 50, 52, and 54, the potential at node L is one N-channel threshold below the 5.0 volt supply voltage $V_{DD}$, i.e. approximately 4.0 volts. A "high" input value of 3.6 volts on the gate of P-channel device 52 is thus within 1.0 volts of the voltage on the source of device 52, so device 52 will shut off completely when its input is "high".

The output of the third inverter, represented by node P, is approximately 4.0 volts in the "high" state and 0.0 volts in the "low" state. These are adequate CMOS levels.

One purpose, therefore, of the reference portion 1, of the circuit has been achieved, and that is to supply predetermined values of $V_A$ and $V_B$ such that the P-channel devices in all of the input buffer circuits turn fully off when an input to such circuits is "high".

Another function of the reference portion 1 is to ensure the stability of the reference voltages $V_A$ and $V_B$ despite slight variations in the supply voltage $V_{DD}$. This is accomplished in part by stabilizing node C by using devices 6, 8, and 10 to set the same voltage at node C as devices 10, 12, and 20.

How this is achieved will now be described. Assume for the moment that node E and node F are at $V_{SS}$. Then node A is one N-channel threshold above $V_{SS}$, node B is two N-channel thresholds above $V_{SS}$, and node C is two N-channel thresholds plus one P-channel threshold above $V_{SS}$. This accounts for the path between nodes C and F through devices 6, 8, and 10.

Still assuming that nodes E and F are at $V_{SS}$, the alternative path between nodes C and F through devices 10, 20, and 12 shows node A at one N-channel threshold above $V_{SS}$, node D at one N-channel threshold and one P-channel threshold above ground, and node C at two N-channel and one P-channel threshold above $V_{SS}$. Thus devices 6, 8, and 10 set the same voltage at node C as devices 10, 12, and 20.

Now the effectiveness of the circuit in minimizing performance variations due to process window variations will be described. When the circuit of the present invention is implemented using a suitable CMOS process, four possible process variations could occur: (1) both the N-channel and P-channel thresholds could be higher than target, (2) both could be lower than target, (3) the N-channel thresholds could be below target and the P-channel thresholds could be above, and (4) N-channel thresholds could be above target and the P-channel thresholds below. Cases (3) and (4) represent the most significant process variations in terms of their overall effects on circuit performance.

To minimize the effect of process variations of the types identified in cases (3) and (4) above, in the reference portion 1 of the CMOS input buffer circuit of the present invention node B is coupled to the gate of device 16, and node D is coupled to the gate of device 18.

Note B is two N-channel thresholds above $V_{SS}$ (i.e. across N-channel devices 10 and 8, assuming for the moment that node F is at $V_{SS}$). Node D is one N-channel threshold (across device 10) and one P-channel threshold (across device 20) above $V_{SS}$.

Thus the difference in voltage between nodes B and D is the difference between an N-channel threshold and a P-channel threshold. It is this voltage difference that is fed back to the gates of devices 16 and 18 to help minimize process window variations.

In addition, the effects of a process window variation of the type wherein the N-channel thresholds are either higher or lower than nominal are also minimized, since the N-channel devices in the reference voltage portion 1 and the N-channel devices in the input buffer portion 3 will be affected substantially to an equal extent.

Node C is used to drive the gates of the N-channel pull-up devices in the CMOS input buffers. Reference circuit 1 detects whether the N-channel devices in the input buffer portion 3 have high thresholds, and it correspondingly boosts the voltage at node C to account for the threshold drop of the pull-up device.

Device 14 is used to clamp node C at two N-channel thresholds and one P-channel threshold above $V_{SS}$ and thereby provide immunity at node C to variations in the power supply $V_{DD}$. For example, assume again that node F is at $V_{SS}$. Node A is one N-channel threshold above $V_{SS}$. Assume that $V_{DD}$ rises from 5.0 volts to 5.5 volts. As node A tries to rise, device 14 (which is normally partially conductive) becomes more conductive, which prevent node C from rising. If $V_{DD}$ falls below 5.0 volts, device 14 becomes less conductive, preventing node C from falling.

Regarding the power consumption of the circuit of the preferred embodiment, reference portion 1 draws power continuously in the amount of approximately only 20 microamps. One such reference circuit 1 is easily capable of driving eight input buffer circuits such as that coupled to input pad 60 or input pad 61.

Regarding the performance of the circuit of the preferred embodiment, the rise time of the output when the input goes from "high" to "low" is only approximately 50% to 65% of the rise time for a known CMOS inverting input buffer circuit when currents in the buffers have been matched, depending upon the process parameters and the value of $V_{DD}$.

The input buffer circuit of the present invention is capable of operation over an even wider supply range than the nominal $V_{DD}$ of 4.5 volts to 5.5 volts. However, the input buffers will begin to draw current as the circuit operates outside its intended supply range.

Figure 3:
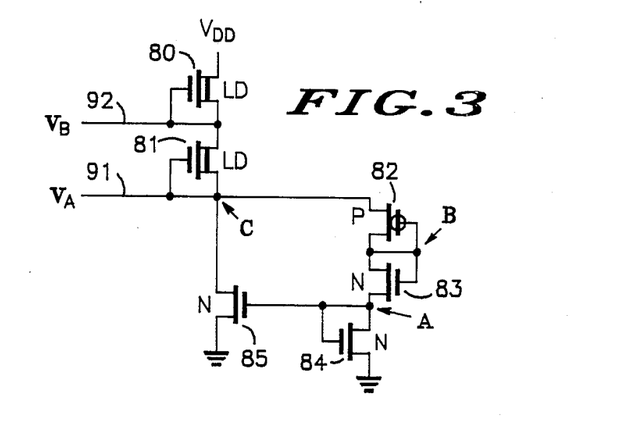
FIG. 3 illustrates a circuit diagram of an alternative embodiment of the reference voltage portion of the CMOS input buffer of the present invention.

FIG. 3 illustrates a circuit diagram of an alternative embodiment of the reference voltage portion of the CMOS input buffer circuit of the present invention. The reference circuit shown in FIG. 3 is identical to that shown generally by reference numeral 1 in FIG. 1, except that devices 12, 16, 18, and 20 have been deleted. The result is a slightly simplified circuit, which may be somewhat less expensive to implement. However, the circuit may be expected to be slightly more susceptible to process variations. Nor would it reduce current consumption to the same extent as the reference circuit shown in FIG. 1.

Figure 4:
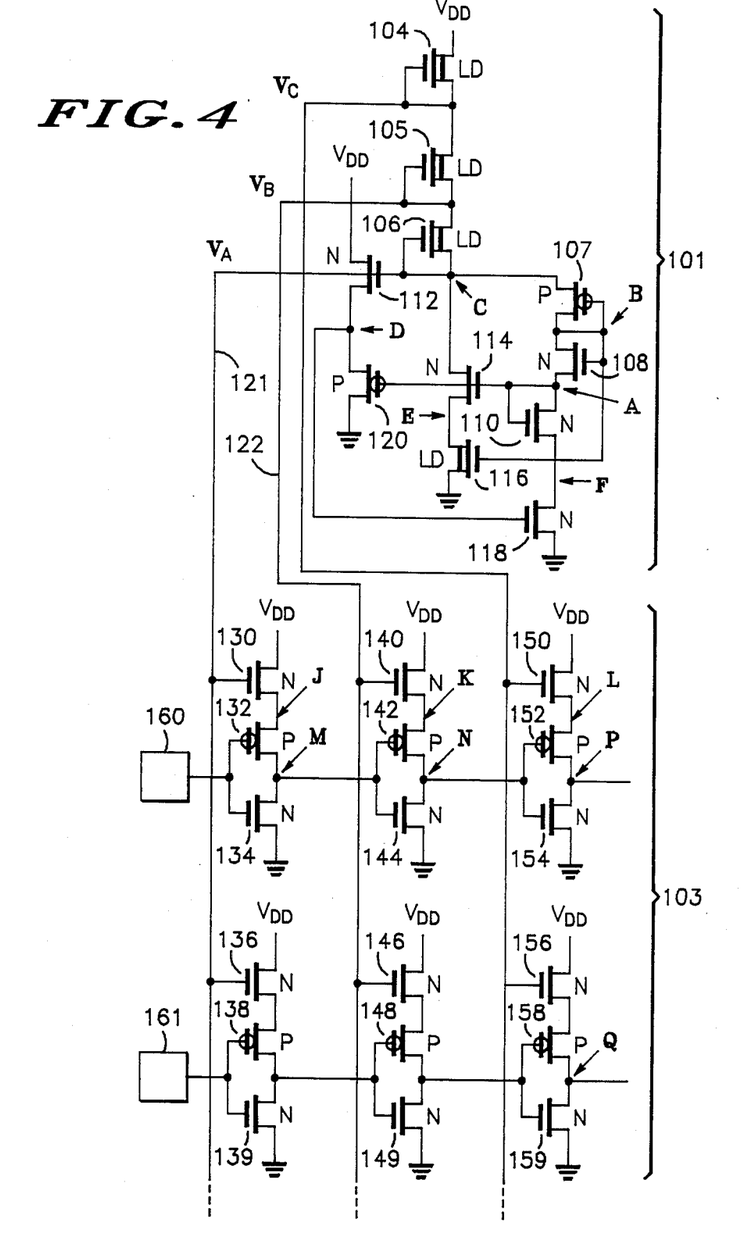
FIG. 4 illustrates a circuit diagram of an alternative embodiment of the CMOS input buffer of the present invention.

FIG. 4 illustrates an alternative embodiment of the CMOS input buffer of the present invention. The embodiment shown in FIG. 4 represents a version of the circuit shown in FIG. 1 which, even if $V_{DD}$ were somewhat higher than the 5.0 volts of the FIG. 1 embodiment, would provide performance equivalent to that of the FIG. 1 embodiment.

In FIG. 4, the reference voltage portion 101 differs from reference voltage portion 1 of FIG. 1, in that an additional lightly depleted N-channel device 104 is coupled between $V_{DD}$ and N-channel device 105 (which corresponds to device 2 in FIG. 1). The gate of device 104 is coupled to its source. The potential at the gate of device 104 represents a third reference voltage, which is indicated as $V_C$, and this drives the pull-up devices 150 and 156 of the input buffers associated with input pads 160 and 161, respectively.

In FIG. 4, N-channel devices 104–106 are ratioed such that $V_B$ is approximately 0.8 volts above $V_A$, and $V_C$ is approximately 0.8 volts above $V_B$. Thus if $V_{DD}$ is higher than 5.0 volts, reference voltage $V_A$ can be scaled down to a value such that the voltage at node J of the first inverter of input buffer portion 103 is low enough (e.g. approximately 3.0 volts) that P-channel device 132 turns off when the input on pad 160 is "high" (e.g. approximately 2.0 volts).

In the FIG. 4 embodiment, the output swing at node M is approximately 0 to 3.0 volts, at node N is approximately 0 to 3.6 volts, and at node P is approximately 0 to 4.0 volts, depending upon the process threshold. The reference portion 101 provides reference voltages $V_A$, $V_B$, and $V_C$ of the correct values, such that each of the P-channel devices 132, 142, and 152 turns off completely when the input on input pad 160 goes "high". This maintains the power consumption of the input buffer circuit at a minimum. The input buffer circuit coupled to input pad 161 functions in a manner equivalent to that of the circuit coupled to input pad 60.

It will be apparent to one of ordinary skill in the art that the magnitudes of the voltages appearing at various nodes throughout the circuits as discussed herein, including the output voltages of the inverter stages, will vary depending upon the process parameters. It will also be aparent that the disclosed CMOS input buffer may be modified in numerous ways and may assume many embodiments other than the preferred form specifically set out and described above.

Accordingly, it is intended by the appended claims to cover all modifications of the invention which fall within the true spirit and scope of the invention.

What is claimed is:

1. A method of translating transistor-transistor logic (TTL) level input signals into complementary metal oxide semiconductor (CMOS) level output signals in an input buffer circuit, said method comprising:
   providing an input terminal for accepting said TTL level input signals;
   providing an output terminal for outputting said CMOS level output signals;
   providing first and second supply voltages;
   generating first and second reference voltages;
   providing first and second CMOS inverter stages, said first CMOS inverter stage being coupled to said input terminal and generating high and low level output signals, said second CMOS inverter stage being responsive to said output signals of said first CMOS inverter stage and generating high and low level output signals to said output terminal;
   coupling said first reference voltage to said first CMOS inverter stage, the magnitude of said first reference voltage being of a predetermined value relative to one of said TTL level input signals, such that when said one TTL level input signal is applied at said input terminal said first CMOS inverter stage generates said low level output signal without providing a DC path; and
   coupling said second reference voltage to said second CMOS inverter stage, the magnitude of said second reference voltage being of a predetermined value relative to said first CMOS inverter stage high level output signal, such that when said first CMOS inverter stage high level output signal is applied to said second CMOS inverter stage said second CMOS inverter stage generates said low level output signal at said output terminal without providing a DC path.

2. A method of translating transistor-transistor logic (TTL) level input signals into complementary metal oxide semiconductor (CMOS) level output signals in an input buffer circuit, said method comprising:
   providing an input terminal for accepting said TTL level input signals;
   providing an output terminal for outputting said CMOS level output signals;
   providing first and second supply voltages;
   generating first, second, and third reference voltages;
   providing first, second, and third CMOS inverter stages, said first CMOS inverter stage being coupled to said input terminal and generating high and low level output signals, said second CMOS inverter stage being responsive to said output signals of said first CMOS inverter stage and generating high and low level output signals, and said third CMOS inverter stage being responsive to said output signals of said second CMOS inverter stage and generating high and low level output signals to said output terminal;
   coupling said first reference voltage to said first CMOS inverter stage, the magnitude of said first reference voltage being of a predetermined value relative to one of said TTL level input signals, such that when said one TTL level input signal is applied at said input terminal said first CMOS inverter stage generates said low level output signal without providing a DC path;
   coupling said second reference voltage to said second CMOS inverter stage, the magnitude of said second reference voltage being of a predetermined value relative to said first CMOS inverter stage high level output signal, such that when said first CMOS inverter stage high level output signal is applied to said second CMOS inverter stage said second CMOS inverter stage generates said low level output signal without providing a DC path; and coupling said third reference voltage to said third CMOS inverter stage, the magnitude of said third reference voltage being of a predetermined value relative to said second CMOS inverter stage high level output signal, such that when said second CMOS inverter stage high level output signal is applied to said third CMOS inverter stage said third CMOS inverter stage generates said low level output signal at said output terminal without providing a DC signal.

3. An input buffer circuit for translating transistor-transistor logic (TTL) level input signals into complementary metal oxide semiconductor (CMOS) level output signals, said circuit comprising:

an input terminal for accepting said TTL level input signals;

an output terminal for outputting said CMOS level output signals;

first and second supply voltages;

a reference circuit coupled to said first and second supply voltages for providing first and second reference voltages;

first and second CMOS inverter stages, said first CMOS inverter stage being coupled to said input terminal and generating high and low level output signals, said second CMOS inverter stage being coupled to receive said output signals of said first CMOS inverter stage and generating high and low level output signals to said output terminal;

means for coupling said first reference voltage to said first CMOS inverter stage, the magnitude of said first reference voltage being of a predetermined value relative to one of said TTL level input signals, such that when said one TTL level input signal is applied at said input terminal said first CMOS inverter stage generates said low level output signal without providing a DC path; and means for coupling said second reference voltage to said second CMOS inverter stage, the magnitude of said second reference voltage being of a predetermined value relative to said first CMOS inverter stage high level output signal, such that when said first CMOS inverter stage high level output signal is applied to said second CMOS inverter stage said second CMOS inverter stage generates said low level output signal at said output terminal without provide a DC path.

4. The input buffer circuit as recited in claim 3 wherein said reference circuit comprises:

a first lightly depleted N-channel transistor having a drain coupled to said first supply voltage, and a gate and a source coupled to a first terminal providing said second reference voltage;

a second lightly depleted N-channel transistor having a drain coupled to the source of said first N-channel transistor, and a gate and a source coupled to a second terminal producing said first reference voltage, said second N-channel transistor having a channel width-to-length ratio with respect to that of said first N-channel transistor such that said first reference voltage is a predetermined amount lower in magnitude than said second reference voltage.

5. The input buffer circuit as recited in claim 4 wherein said reference circuit further comprises:

a third N-channel transistors having a drain coupled to said first supply voltage, a gate coupled to said second terminal, and a source;

a first P-channel transistor having a source coupled to said source of said third N-channel transistor, a gate coupled to a third terminal, and a drain coupled to said second supply voltage;

a fourth N-channel transistor having a drain coupled to said second terminal, a gate coupled to said third terminal, and a source;

a fifth lightly depleted N-channel transistor having a drain coupled to the source of said fourth N-channel transistor, a gate coupled to a fourth terminal, and a source coupled to said second supply voltage;

a second P-channel transistor having a source coupled to said second terminal, and a gate and a source coupled to said fourth terminal;

a sixth N-channel transistor having a drain and a gate coupled to said fourth terminal, and a source coupled to said third terminal;

a seventh N-channel transistor having a drain and a gate coupled to said third terminal, and a source; and an eighth N-channel transistor having a drain coupled to the source of said seventh N-channel transistor, a gate coupled to the source of said first P-channel transistor, and a source coupled to said second supply voltage.

6. The input buffer circuit as recited in claim 4, wherein said reference circuit further comprises:

a first P-channel transistor having a source coupled to said second terminal, and a gate and a drain coupled to a third terminal;

a third N-channel transistor having a drain and a gate coupled to said third terminal, and a source coupled to a fourth terminal;

a fourth N-channel transistor having a drain coupled to said second terminal, a gate coupled to said fourth terminal, and a source coupled to said second supply voltage; and a fifth N-channel transistor having a drain and a gate coupled to said fourth terminal, and a source coupled to said second supply voltage.

7. A complementary metal oxide semiconductor (CMOS) input buffer circuit accepting first and second transistor-transistor logic (TTL) level input signals and outputting first and second CMOS level output signals, said circuit comprising:

an input terminal for accepting said TTL level input signals;

an output terminal for outputting said CMOS level output signals;

first and second supply voltages;

a reference circuit coupled to said first and second supply voltages for providing first and second reference voltages;

first and second CMOS inverter stages, each comprising at least a first N-channel transistor and a P-channel transistor coupled as an inverter and a second N-channel transistor having a first electrode coupled to said first supply voltage, a second electrode coupled to said P-channel transistor, and a gate electrode, said first CMOS inverter stage being coupled to said input terminal and generating first and second level output signals, said second CMOS inverter stage being coupled to receive said output signals of said first CMOS inverter stage and generating first and second level output signals to said output terminal;

means for coupling said first reference voltage to said gate electrode of said second N-channel transistor in said first CMOS inverter stage, the magnitude of said first reference voltage being of a predetermined value relative to said second TTL level input signal, such that when said second TTL level input signal is applied at said input terminal said P-channel transistor of said first CMOS inverter stage becomes non-conductive; and means for coupling said second reference voltage to said gate electrode of said second N-channel transistor in said second CMOS inverter stage, the magnitude of said second reference voltage being of a predetermined value relative to said first CMOS inverter stage second level output signal, such that when said first CMOS inverter stage second level output signal is applied to said second CMOS inverter stage said P-channel transistor of said second CMOS inverter stage becomes non-conductive.

8. A monolithic integrated circuit having fabricated thereon at least one complementary metal oxide semiconductor (CMOS) input buffer circuit accepting first and second transistor-transistor logic (TTL) level input signals and outputting first and second CMOS level output signals, said input buffer circuit comprising:

an input terminal for accepting said TTL level input signals;

an output terminal for outputting said CMOS level output signals;

first and second supply voltages;

a reference circuit coupled to said first and second supply voltages for providing first and second reference voltages;

first and second CMOS inverter stages, each comprising at least a first N-channel transistor and a P-channel transistor coupled as an inverter and a second N-channel transistor having a first electrode coupled to said first supply voltage, a second electrode coupled to said P-channel transistor, and a gate electrode, said first CMOS inverter stage being coupled to said input terminal and generating first and second level output signals, said second CMOS inverter stage being coupled to receive said output signals of said first CMOS inverter stage and generating first and second level output signals to said output terminal;

means for coupling said first reference voltage to said gate electrode of said second N-channel transistor in said first CMOS inverter stage, the magnitude of said first reference voltage being of a predetermined value relative to said second TTL level input signal, such that when said second TTL level input signal is applied at said input terminal said P-channel transistor of said first CMOS inverter stage becomes non-conductive; and means for coupling said second reference voltage to said gate electrode of said second N-channel transistor in said second CMOS inverter stage, the magnitude of said second reference voltage being of a predetermined value relative to said first CMOS inverter stage second level output signal, such that when said first CMOS inverter stage second level output signal is applied to said second CMOS inverter stage said P-channel transistor of said second CMOS inverter stage becomes non-conductive.

9. An input buffer circuit for translating transistor-transistor logic (TTL) level input signals into complementary metal oxide semiconductor (CMOS) level input signals, said circuit comprising:

an input terminal for accepting said TTL level input signals;

an output terminal for outputting said CMOS level output signals;

first and second supply voltages;

a reference circuit coupled to said first and second supply voltages for providing first, second, and third reference voltages;

first, second, and third CMOS inverter stages, said first CMOS inverter stage being coupled to said input terminal and generating high and low level output signals, said second CMOS inverter stage being coupled to receive said output signals of said first CMOS inverter stage and generating high and low level output signals, and said third CMOS inverter stage being coupled to receive said output signals of said second CMOS inverter stage and generating high and low level output signals to said output terminal;

means for coupling said first reference voltage to said first CMOS inverter stage, the magnitude of said first reference voltage being of a predetermined value relative to one of said TTL level input signals, such that when said one TTL level input signal is applied at said input terminal said first CMOS inverter stage generates said low level output signal without providing a DC path;

means for coupling said second reference voltage to said second CMOS inverter stage, the magnitude of said second reference voltage being of a predetermined value relative to said first CMOS inverter stage high level output signal, such that when said first CMOS inverter stage high level output signal is applied to said second CMOS inverter stage said second CMOS inverter stage generates said low level output signal without providing a DC path; and means for coupling said third reference voltage to said third CMOS inverter stage, the magnitude of said third reference voltage being of a predetermined value relative to said second CMOS inverter stage high level output signal, such that when said second CMOS inverter stage high level output signal is applied to said third CMOS inverter stage said third CMOS inverter stage generates said low level output signal at said output terminal without providing a DC path.

10. The input buffer circuit as recited in claim 9, wherein said reference circuit comprises:

a first lightly depleted N-channel transistor having a drain coupled to said first supply voltage, and a gate and a source coupled to a first terminal providing said third reference voltage;

a second lightly depleted N-channel transistor having a drain coupled to the source of said first N-channel transistor, and a gate and a source coupled to a second terminal providing said second reference voltage, said second N-channel transistor having a channel width-to-length ratio with respect to that of said first N-channel transistor such that said second reference voltage is a predetermined amount lower in magnitude than said third reference voltage.

a third lightly depleted N-channel transistor having a drain coupled to the source of said second N-channel transistor, and a gate and a source coupled to a third terminal providing said first reference voltage, said third N-channel transistor having a channel width-to-length ratio with respect to that of said second N-channel transistor such that said first reference voltage is a predetermined amount lower in magnitude than said second reference voltage.

11. The input buffer circuit as recited in claim 10 wherein said reference circuit further comprises:

a fourth N-channel transistor having a drain coupled to said first supply voltage, a gate coupled to said third terminal, and a source;

a first P-channel transistor having a source coupled to said source of said fourth N-channel transistor, a gate coupled to a fourth terminal, and a drain coupled to said second supply voltage;

a fifth N-channel transistor having a drain coupled to said third terminal, a gate coupled to said fourth terminal, and a source;

a sixth lightly depleted N-channel transistor having a drain coupled to the source of said fifth N-channel transistor, a gate coupled to a fifth terminal, and a source coupled to said second supply voltage;

a second P-channel transistor having a source coupled to said third terminal, and a gate and a source coupled to said fifth terminal;

a seventh N-channel transistor having a drain and a gate coupled to said fifth terminal, and a source coupled to said fourth terminal;

an eighth N-channel transistor having a drain and a gate coupled to said fourth terminal, and a source; and a ninth N-channel transistor having a drain coupled to the source of said eighth N-channel transistor, a gate coupled to the source of said first P-channel transistor, and a source coupled to said second supply voltage.

12. A complementary metal oxide semiconductor (CMOS) input buffer circuit accepting first and second transistor-transistor logic (TTL) level input signals and outputting first and second CMOS level output signals, said circuit comprising:

an input terminal for accepting said TTL level input signals;

an output terminal for outputting said CMOS level output signals;

first and second supply voltages;

a reference circuit coupled to said first and second supply voltages for providing first, second, and third reference voltages;

first, second, and third CMOS inverter stages, each comprising at least a first N-channel transistor and a P-channel transistor coupled as an inverter and a second N-channel transistor having a first electrode coupled to said first supply voltage, a second electrode coupled to said P-channel transistor, and a gate electrode, said first CMOS inverter stage being coupled to said input in terminal and generating first and second level output signals, said second CMOS inverter stage being coupled to receive said output signals of said first CMOS inverter stage and generating first and second level output signals, and said third CMOS inverter stage being coupled to receive said output signals of said second CMOS inverter stage and generating first and second level output signals to said output terminal;

means for coupling said first reference voltage to said gate electrode of said second N-channel transistor in said first CMOS inverter stage, the magnitude of said first reference voltage being of a predetermined value relative to said second TTL level input signal, such that when said second TTL level input signal is applied at said input terminal said P-channel transistor of said first CMOS inverter stage becomes non-conductive;

means for coupling said second reference voltage to said gate electrode of said second N-channel transistor in said second CMOS inverter stage, the magnitude of said second reference voltage being of a predetermined value relative to said first CMOS inverter stage second level output signal, such that when said first CMOS inverter stage second level output signal is applied to said second CMOS inverter stage said P-channel transistor of said second CMOS inverter stage becomes non-conductive; and means for coupling said third reference voltage to said gate electrode of said second N-channel transistor in said third CMOS inverter stage, the magnitude of said third reference voltage being of a predetermined value relative to said second CMOS inverter stage second level output signal, such that when said second CMOS inverter stage second level output signal is applied to said third CMOS inverter stage said P-channel transistor of said third CMOS inverter stage becomes non-conductive.

13. A monolithic integrated circuit having fabricated thereon at least one complementary metal oxide semiconductor (CMOS) input buffer circuit accepting first and second transistor-transistor logic (TTL) level input signals and outputting first and second CMOS level output signals, said input buffer circuit comprising:

an input terminal for accepting said TTL level input signals;

an output terminal for outputting said CMOS level output signals;

first and second supply voltages;

a reference circuit coupled to said first and second supply voltages for providing first, second, and third reference voltages;

first, second, and third CMOS inverter stages, each comprising at least a first N-channel transistor and a P-channel transistor coupled as an inverter and a second N-channel transistor having a first electrode coupled to said first supply voltage, a second electrode coupled to said P-channel transistor, and a gate electrode, said first CMOS inverter stage being coupled to said input terminal and generating first and second level output signals, said second CMOS inverter stage being coupled to receive said output signals of said first CMOS inverter stage and generating first and second level output signals, and said third CMOS inverter stage being coupled to receive said output signals of said second CMOS inverter stage and generating first and second level output signals to said output terminal;

means for coupling said first reference voltage to said gate electrode of said second N-channel transistor in said first CMOS inverter stage, the magnitude of said first reference voltage being of a predetermined value relative to said second TTL level input signal, such that when said second TTL level input signal is applied to said input terminal said P-channel transistor of said first CMOS inverter stage becomes non-conductive;

means for coupling said second reference voltage to said gate electrode of said second N-channel resistor in said second CMOS inverter stage, the magnitude of said second reference voltage being of a predetermined value relative to said first CMOS inverter stage second level output signal, such that when said first CMOS inverter stage second level output signal is applied to said second CMOS inverter stage said P-channel transistor of said second CMOS inverter stage becomes non-conductive; and means for coupling said third reference voltage to said gate electrode of said second N-channel transistor in said third CMOS inverter stage, the magnitude of said third reference voltage being of a predetermined value relative to said second CMOS inverter stage second level output signal, such that when said second CMOS inverter stage second level output signal is applied to said third CMOS inverter stage said P-channel transistor of said third CMOS inverter stage becomes non-conductive.

* * * * *